United States Patent [19]

Kosak et al.

[11] Patent Number: 4,541,389

[45] Date of Patent: Sep. 17, 1985

[54] CURRENT REGULATOR FOR AN ELECTROMAGNETIC LOAD UTILIZED IN CONJUNCTION WITH AN INTERNAL COMBUSTION ENGINE

[75] Inventors: Wolfgang Kosak, Möglingen; Rolf Reischl, Stuttgart; Andreas Pschera, Beerfelden, all of Fed. Rep. of Germany

[73] Assignee: Robert Bosch GmbH, Stuttgart, Fed. Rep. of Germany

[21] Appl. No.: 620,054

[22] Filed: Jun. 13, 1984

[30] Foreign Application Priority Data

Jul. 12, 1983 [DE] Fed. Rep. of Germany ....... 3325044

[51] Int. Cl.⁴ .............................................. F02D 5/00
[52] U.S. Cl. .................................... 123/490; 361/208; 361/152; 123/493
[58] Field of Search ................ 123/490; 361/152, 154, 361/208

[56] References Cited

U.S. PATENT DOCUMENTS

| | | | |
|---|---|---|---|
| 3,351,822 | 11/1967 | Imahashi | 361/152 |
| 3,377,518 | 4/1968 | Radcliffe | 361/154 |
| 3,400,304 | 9/1968 | Ziegler | 361/152 |
| 4,148,090 | 4/1979 | Kawai | 361/154 |
| 4,154,198 | 8/1979 | Hoshi | 123/490 |
| 4,377,144 | 3/1983 | Takahashi | 361/152 |
| 4,417,201 | 11/1983 | Reddy | 361/154 |
| 4,491,113 | 1/1985 | Gassler | 123/490 |

Primary Examiner—Ronald B. Cox
Attorney, Agent, or Firm—Walter Ottesen

[57] ABSTRACT

The invention is directed to a current regulator for an electromagnetic load used in conjunction with an internal combustion engine. The regulator produces positive and/or negative currents flowing through an electromagnetic load. In this arrangement, the two potentials present at a precision resistor that is connected in series with the load are adjusted to freely selectable values. To obtain both positive and negative currents, the current defined by the voltage drop occurring along the precision resistor is provided by a bridge circuit made up of four current-controlling arrangements. Allowance can be made for particular operating conditions of the current regulator simply by presetting desired values.

14 Claims, 2 Drawing Figures

CURRENT REGULATOR FOR AN ELECTROMAGNETIC LOAD UTILIZED IN CONJUNCTION WITH AN INTERNAL COMBUSTION ENGINE

BACKGROUND OF THE INVENTION

U.S. Pat. No. 3,786,314 discloses a current regulating arrangement wherein a precision resistor, a current controlling device and an electromagnetic load are connected in series. The resistor terminal on the side close to the load is then regulated to a predeterminable potential by means of the current controlling device. The voltage drop from the battery voltage applied to the other resistor terminal relative to the predetermined potential generates a specific amount of current flowing through the electromagnetic load. Since in this arrangement the potential controllable by the current controlling device can never become greater than the battery voltage, the flow of current through the load can only be in one direction.

This means that only positive and no negative currents can be generated by means of the current controlling device.

SUMMARY OF THE INVENTION

By contrast, the current regulator of the invention affords the advantage of enabling both resistor terminals to be regulated to predeterminable potentials. In this arrangement, the potential of the one terminal may be greater or smaller than the potential of the other terminal. The arrangement also permits the flow of both positive and negative currents through the electromagnetic load. For this purpose, the currents are generated, for example, by a bridge circuit including a maximum of four current controllers. This bridge circuit also provides an easy method of realizing particular operating conditions such as fuel supply cutoff in overrun operation, emergency operation, et cetera.

BRIEF DESCRIPTION OF THE DRAWING

The invention will now be described with reference to the drawing wherein.

DESCRIPTION OF THE PREFERRED EMBODIMENTS OF THE INVENTION

Figure 1:
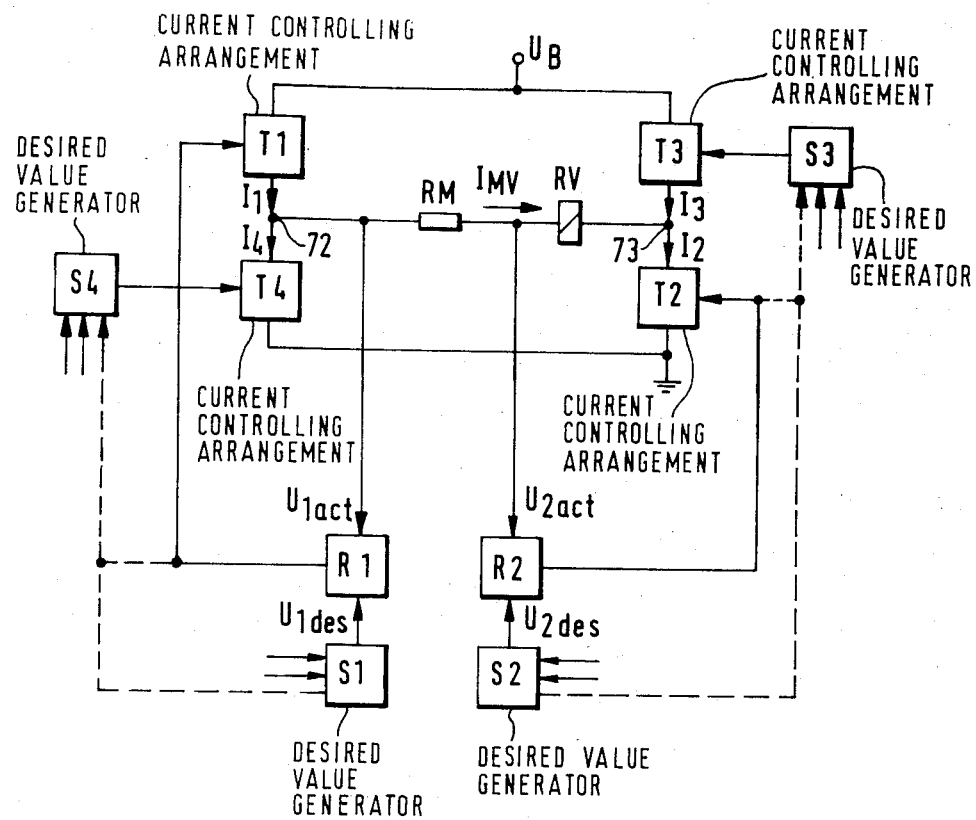
FIG. 1 is a block diagram showing the basic configuration of a current regulator according to the invention for an electromagnetic load; and, FIG. 2 is a circuit diagram of the current regulator of FIG. 1.

The current regulator of FIG. 1 includes a precision resistor RM, an electromagnetic load RV, current controlling arrangements T1, T2, T3 and T4, regulating arrangements R1 and R2, and desired value generators S1, S2, S3 and S4.

Precision resistor RM and load RV are connected in series. Current controlling arrangements T1 and T4 are connected to each other, with T1 being further connected to the battery voltage $U_B$ and T4 to ground. By analogy, current controlling arrangements T3 and T2 are connected to each other, with the battery voltage $U_B$ being applied to T3 and T2 being connected to ground. The junction 72 between current controlling arrangements T1 and T4 is connected to precision resistor RM, while the junction 73 between current controlling arrangements T3 and T2 is connected to the electromagnetic load RV. The precision resistor access terminal on the side remote from the load is assumed to have potential $U_{1act}$, and the potential of the junction between the precision resistor and the load is assumed to be $U_{2act}$. Voltages $U_{1act}$ and $U_{2act}$ are applied to regulating arrangements R1 and R2, respectively. Further, voltages $U_{1des}$ and $U_{2des}$ are applied to regulating arrangements R1 and R2, respectively. These two current controlling arrangements T3 and T4 are activated by desired value generators S3 and S4, respectively. All desired value generators S1 to S4 may have applied to their respective inputs one or several input quantities. The current flowing through precision resistor RM and load RV is identified by $I_{MV}$.

Regulating arrangements R1 and R2 compare the voltages $U_{1act}$ with $U_{1des}$ and $U_{2act}$ with $U_{2des}$, respectively, and generate therefrom output signals that are used for activation of the current controlling arrangements T1 and T2, respectively. Current controlling arrangements T1 and T2 then correct the potentials on either side of precision resistor RM such that the two following equations apply: $U_{1act}=U_{1des}$ and $U_{2act}=U_{2des}$. Neglecting the currents branching from the series circuit made up of precision resistor RM and load RV to the two regulating arrangements R1 and R2, the following equation will apply to the current flowing through the series connected precision resistor RM and load RV:

$I_{MV}=(U_{1des}-U_{2des})/RM$. By means of current controlling arrangements T3 and T4, currents are then supplied to junction 73 and led away from junction 72, respectively. If voltage $U_{1des}$ is equal to voltage $U_{2des}$, the equations:

$$I_1=I_4 \text{ and } I_3=I_2$$

apply, and the current $I_{MV}$ flowing through precision resistor RM and load RV is equal to zero.

If voltage $U_{1des}$ is greater than voltage $U_{2des}$, current controlling arrangement T1 will supply the currents $I_4+I_{MV}$. Thus, a positive current $I_{MV}$ will flow through precision resistor RM and load RV.

If voltage $U_{2des}$ is greater than voltage $U_{1des}$, current controlling arrangement T4 will ground the currents $I_2-I_{MV}$, and current controlling arrangement T4 will direct the currents $I_1-I_{MV}$ to ground. Thus, a negative current $I_{MV}$ will flow through precision resistor RM and load RV. This current is always determined by the difference between the two voltages $U_{1des}$ and $U_{2des}$, irrespective of whether current $I_{MV}$ is positive or negative.

Figure 2:
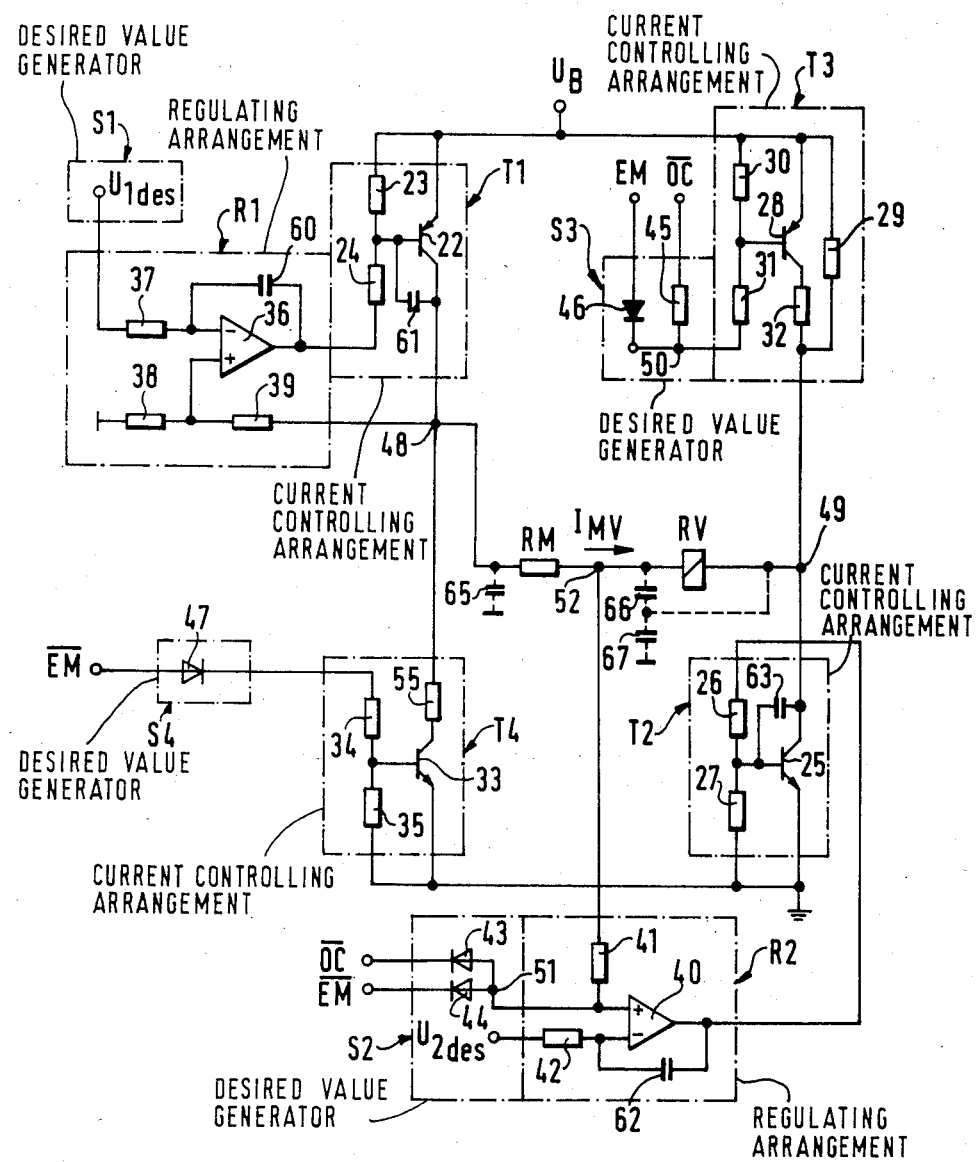

FIG. 2 shows the circuit diagram of a current regulator for an electromagnetic load. In this circuit, the current controlling arrangement T1 is formed by a transistor 22 and two resistors 23 and 24. Current controlling arrangement T2 is made up of a transistor 25 and resistors 26 and 27. Transistor 28 and resistors 29 to 32 connected thereto form current controlling arrangement T3. Current controlling arrangement T4 includes a transistor 33 and three resistors 55, 34 and 35. Regulating arrangement R1 is formed by an operational amplifier 36 to which resistors 37, 38 and 39 are connected. Regulating arrangement R2 is made up of an operational amplifier 40 and resistors 41 and 42. The input voltage $U_{1des}$ is generated by desired value generator S1. The reference voltage $U_{2des}$ is provided by desired value generator S2. Further, desired value generator S2 also includes two diodes 43 and 44. Desired value generator S3 includes a resistor 45 and a diode 46. Finally, desired value generator S4 includes a diode 47.

As in FIG. 1, the current flowing through precision resistor RM and electromagnetic load RV is identified by $I_{MV}$. Desired value generators S2, S3 and S4 have applied to their inputs signal OC which is indicative of an overrun cutoff condition; signal EM indicative of an emergency operation; and, the signals $\overline{OC}$ and $\overline{EM}$ corresponding to the inverted values thereof. These input quantities possess either ground potential or potential $U_B$. The whole circuit is applied to battery voltage $U_B$ with respect to ground.

The base of transistor 22 is connected to resistors 23 and 24, with resistor 23 being further applied to battery voltage $U_B$, and resistor 24 being connected to the output of operational amplifier 36. The emitter of transistor 22 is likewise applied to battery voltage $U_B$, while its collector is connected to junction 48. The voltage divider made up of resistors 26 and 27 is applied to the base of transistor 25. Further, resistor 26 is connected to the output of operational amplifier 40, and resistor 27 is connected to ground. The collector of transistor 25 is connected to junction 49, its emitter being connected to ground.

The base of transistor 28 is connected to resistors 30 and 31, with resistor 30 being further applied to battery voltage $U_B$, while resistor 31 is connected to a junction 50. The collector of transistor 28 is connected to a resistor 32, and both the collector-to-emitter region of transistor 28 and resistor 32 are bridged by another resistor 29. The emitter of transistor 28 is also applied to battery voltage $U_B$. Resistors 32 and 29 are connected at junction 49.

The base of transistor 33 is connected to resistor 35 having its other terminal connected to ground, and further to resistor 34 which has its other terminal connected to the cathode of diode 47. The collector of transistor 33 is connected to junction 48 via resistor 55, while its emitter is connected to ground. The inverting input of operational amplifier 36 is connected to resistor 37 having the input voltage $U_{1des}$ applied to its other terminal. The non-inverting input of operational amplifier 36 is connected to ground via resistor 38 and, via resistor 39, to junction 48, thus being fed back to the output of operational amplifier 36 via transistor 22 and resistor 24. The inverting input of operational amplifier 40 is connected to a resistor 42 having the reference voltage $U_{2des}$ applied to its other terminal. The non-inverting input of operational amplifier 40 is connected to a junction 51 and, via a resistor 41, to another junction 52.

Precision resistor RM is located between junctions 48 and 52, and the electromagnetic load RV is located between junctions 52 and 49. In this manner, the non-inverting input of operational amplifier 40 is fed back to its output via resistor 41, load RV, transistor 25 and resistor 26. Two diodes 43, 44 have their anodes connected to junction 51, while their cathodes receive the input signals. One input signal is the inverted signal $\overline{OC}$ indicative of an overrun cutoff condition, the other input signal is the inverted signal $\overline{EM}$ indicative of an emergency operation.

Junction 50 is connected to a resistor 45 the other terminal of which has the inverted overrun-cutoff signal $\overline{OC}$ applied thereto. Further, this junction 50 is connected to the cathode of a diode 46 which has the emergency operation signal EM applied to its anode. The cathode of a diode 47 is connected to resistor 34. The inverted emergency operation signal $\overline{EM}$ is applied to the anode of diode 47.

By means of regulating arrangement R2 which is made up of operational amplifier 40 and resistors 41 and 42, and by means of current controlling arrangement T2 which includes transistor 25 and resistors 26 and 27, the potential of junction 52 is corrected to the value of reference voltage $U_{2des}$ which is supplied by desired value generator S2 of regulating arrangement R2.

Regulating arrangement R1 which is made up of operational amplifier 36 and resistors 37, 38 and 39, and current-controlling arrangement T1 which includes transistor 22 and resistors 23 and 24, correct the potential of junction 48 to the value of input voltage $U_{1des}$ predetermined by desired-value generator S1.

Reference voltage $U_{2des}$ is a constant voltage, while input voltage $U_{1des}$ is variable. As a result, the voltage drop along precision resistor RM is only dependent on input voltage $U_{1des}$. Neglecting the currents flowing from junction 48 to resistor 39 and from junction 52 to resistor 41, the following equation applies to the current $I_{MV}$ flowing through precision resistor RM and electromagnetic load RV:

$$I_{MV}=(U_{1des}-U_{2des})/R_M=f(U_{1des}), \text{ since}$$
$$U_{2des}=\text{constant}.$$

Accordingly, the current $I_{MV}$ is likewise only dependent on input voltage $U_{1des}$.

In dependence on the voltage drop $(U_{1des}-U_{2des})$ occurring along precision resistor RM, the current controlling arrangements T1 to T4 produce currents of such magnitude that the above equation applies to the current $I_{MV}$ flowing through precision resistor RM and load RV.

The purpose of desired value generators S1 to S4 is to deliver the input voltage $U_{1des}$ and the desired voltage $U_{2des}$ to the two regulating arrangements R1 and R2, respectively. Further, in the event of an overrun cutoff or emergency operation, their function is to bring the entire circuit into the state desired for the relevant operating condition.

In the event of an overrun cutoff operation, an increased negative current $I_{MV}$ is to flow through precision resistor RM and load RV. This is accomplished by means of desired-value generator S3 that activates the voltage divider made up of resistors 30 and 31 at the base of transistor 28, as a result of which an increased current is produced by the current-controlling arrangement T3. At the same time, the non-inverting input of operational amplifier 40 is grounded by means of desired-value generator S2, as a result of which transistor 25 becomes high impedance, thereby inhibiting the flow of current through current-controlling arrangement T2. In addition, in the event of an overrun cutoff operation, desired-value generator S1 corrects the voltage $U_{1des}$ to the smallest possible value. Consequently, the non-inverting input of operational amplifier 36 has a higher potential than its inverting input, as a result of which transistor 22 becomes high impedance, thereby inhibiting the flow of current through current-controlling arrangement T1. Therefore, if an overrun cutoff condition is present, only the increased negative current $I_{MV}$ generated by current-controlling arrangement T3 flows through precision resistor RM and load RV.

If the operating condition is an emergency operation, current $I_{MV}$ is to become zero. In this condition, current-controlling arrangements T2 and T4 are disabled by means of desired-value generators S2 and S4, respectively. At the same time, the operating condition of an overrun cutoff operation is made impossible by means of desired-value generator S3. Thus, the current $I_{MV}$ passing through precision resistor RM and load RV becomes zero as desired for an emergency operation.

Considering that load RV is an inductive load because no regulated voltage is provided as supply voltage $U_B$, and considering further that overrun cutoff, emergency operations, and potential short circuits place high demands on the regulating arrangement, a safe operation of the current regulator makes damping provisions necessary. A first possibility is to avoid oscillations of the current regulator by means of capacitors 60 to 63. In this arrangement, capacitor 60 is located between the inverting input and the output of operational amplifier 36, capacitor 61 is between the base and the collector of transistor 22, capacitor 62 between the inverting input and the output of operational amplifier 40, and capacitor 63 between the base and the collector of transistor 25.

A second possibility worth considering is the addition of capacitors 65, 66 and 67 to the current regulator. In this second arrangement, capacitors 65 and 67 are placed between junctions 48 and 49, respectively, and ground, whereas capacitor 66 is connected in parallel to load RV between junctions 49 and 52.

In the event of a short circuit of junction 52 with respect to ground, the entire potential residing at junction 48 will drop along precision resistor RM with respect to ground. Therefore, this resistor has to be dimensioned in a manner preventing it from being destroyed by the developing heat. In the event of a short circuit of junction 49 with respect to ground, the potential at junction 48 will likewise drop with respect to ground along precision resistor RM and electromagnetic load RV. Thus, it is also necessary for load RV to be configured in a manner preventing its destruction by the currents produced under short-circuit conditions. If such a short circuit occurs, the movements of an electromagnetic final control element, for example, are not reliable. In both cases of a short circuit described, only positive currents $I_{MV}$ can flow through precision resistor RM and load RV. If a short circuit exists between junctions 52 and 49, this is of no appreciable influence on current $I_{MV}$ since even in the presence of a short-circuited load RV, it is possible to continue correction of the potentials of junctions 48 and 52.

It is also possible to sense a short-circuit condition of junction 52 or 49 by comparing the voltage of junction 52 with a predetermined voltage and by reducing the current flowing through the precision resistor and the electromagnetic load to zero via desired-value generators S1 to S4 which may be accomplished, for example, by means of the emergency operating condition.

Further, the possibility exists to compare the voltage lying at junction 48 with a voltage that is proportional to input voltage $U_{1des}$. This makes it possible to detect a short-circuit condition of the electromagnetic load and permits a self-calibration of the entire current regulator by means of desired-value generators S1 to S4.

Moreover, junction 48 can also be fed back to desired-value generator S1 in order to have a short-circuit condition detected and a self-calibration performed there by a computer, for example.

If only positive values are required for current $I_{MV}$ flowing through precision resistor RM and load RV, current-controlling arrangements T3 and T4 and their corresponding desired-value generators S3 and S4 are not necessary and may therefore be dispensed with.

On the other hand, if high positive or negative currents are desired, this may be accomplished by the inclusion of further transistors in the corresponding current-controlling circuit configurations.

If high currents are required particularly in overrun cutoff operation, this may be achieved, for instance, by substituting current sources switchable by the overrun cutoff signal OC for the current-controlling arrangements T3 and T4.

If only an overrun cutoff and no emergency operation is desired, a resistor with a transistor connected in parallel, for example, may be substituted for each of the current-controlling arrangements T3 and T4.

If neither one of the overrun cutoff or emergency operating conditions is desired and if only low negative currents are required, current-controlling arrangements T3 and T4 are reduced to include one resistor each.

It is also possible to combine current-controlling arrangements and regulating arrangements in one circuit and to substitute circuits other than those illustrated in the embodiment for the current-controlling and regulating arrangements.

Regarding the inputs into the desired-value generators, these are not limited to signals indicating overrun cutoff and emergency conditions, on the contrary, these generators are also in a position to consider variations of ambient temperature, of supply voltage $U_B$, et cetera. Even the signals produced by the regulating arrangements can be fed to the desired-value generators as input quantities in order to thereby influence the associated current-controlling arrangements.

It is understood that the foregoing description is that of the preferred embodiments of the invention and that various changes and modifications may be made thereto without departing from the spirit and scope of the invention as defined in the appended claims.

What is claimed is:

1. A current regulator for an electromagnetic load used in conjunction with an internal combustion engine and connected in series with a precision resistor having two access terminals at respective ends thereof, the current regulator comprising:

first voltage means for providing a first desired voltage which is freely selectable;

first regulator means for comparing the actual voltage at one of said access terminals to said first voltage and for regulating the potential at said one access terminal to correspond to said first voltage irrespective of the potential at the other one of said access terminals;

second voltage means for providing a second desired voltage which is freely selectable; and, second regulator means for comparing the actual voltage at said other access terminal to said second voltage and for regulating the potential at said other access terminal to correspond to said second voltage irrespective of the potential at said one access terminal.

2. The current regulator of claim 1, said first regulator means including: a first regulator for making said first-mentioned comparison and generating a control signal in response thereto; and, a first current controller connected in series with said precision resistor and said electromagnetic load; and, said second regulator means including: a second regulator for making said second-mentioned comparison and generating a control signal in response thereto; and, a second current controller connected to form a series circuit made up of said first current controller, said precision resistor, said electromagnetic load and said second current controller, said first voltage means providing a first voltage greater than said second voltage thereby causing said first current controller to supply a current to said precision resistor and said electromagnetic load which flows in one direction.

3. A current regulator for an electromagnetic load used in conjunction with an internal combustion engine and connected in series with a precision resistor having two access terminals at respective ends thereof, the current regulator comprising:
first voltage means for providing a first desired voltage which is freely selectable;
a first regulator for comparing the actual voltage at one of said access terminals to said first voltage and providing an output indicative of said comparison;
a first current controller for receiving said first regulator output and being connected to one end of the series circuit made up of said electromagnetic load and said precision resistor;
second voltage means for providing a second desired voltage which is freely selectable;
a second regulator for comparing the actual voltage at the other one of said access terminals to said second voltage and providing an output indicative of said last-mentioned comparison;
a second current controller for receiving said second regulator output and being connected to the other end of said series circuit;
a third current controller also connected to said other end of said series circuit; and,
a fourth current controller also connected to said one end of said series circuit; and,
said current controllers being connected one to the other to conjointly define a bridge circuit with said series circuit being connected across said bridge, whereby current flows through said series circuit in a first direction when said first desired voltage is greater than said second desired voltage and in a second direction therethrough when said second desired voltage is greater than said first desired voltage.

4. The current regulator of claim 3, said first current controller responding to said output of said first regulator for regulating the potential of said first access terminal to correspond to said first desired voltage; and, said second current controller responding to said output of said second regulator for regulating the potential of said second access terminal to correspond to said second desired voltage.

5. The current regulator of claim 4, said second voltage means being set to provide a constant second desired voltage whereby the potential at said second access terminal is regulated to correspond to said constant second desired voltage.

6. The current regulator of claim 5, said first voltage means being adjusted to provide a variable first desired voltage whereby the potential at said first access terminal is regulated to correspond thereto, thereby determining the magnitude of the current through the electromagnetic load.

7. The current regulator of claim 6, comprising third desired voltage means for acting on said third current controller and fourth desired voltage means for acting on said fourth current controller, said voltage means being adjustable for sending predetermined currents through said electromagnetic load in correspondence to specific operating conditions of the internal combustion engine.

8. The current regulator of claim 7 for the overrun cutoff mode of operation of the internal combustion engine, said third voltage means being responsive to an input to cause said third current controller to conduct increased current; said second voltage means being responsive to an input causing said second regulator to cause said second current controller to discontinue conduction of current; said first voltage means being responsive to an input causing said first regulator to cause said first current controller to discontinue conduction of current whereby only an increased negative current from said third current controller flows through said precision resistor and said electromagnetic load for the overrun cutoff mode of operation.

9. The current regulator of claim 7 for the emergency mode of operation of the internal combustion engine, said second voltage means being responsive to an input causing said second regulator to cause said second current controller to discontinue conduction of current; said fourth voltage means being responsive to an input to cause said fourth current controller to discontinue the conduction of current; said third voltage means being responsive to an input to cause said third current controller to discontinue conduction of current whereby the current flowing through said precision resistor and said electromagnetic load is reduced to zero for said emergency mode of operation.

10. The current controller of claim 3, comprising damping means arranged with respect to said first regulator, said first current controller, said second regulator and said second current controller.

11. The current controller of claim 3, comprising damping means arranged with respect to said precision resistor and said electromagnetic load.

12. The current controller of claim 9, said other one of said access terminals being directly between said precision resistor and said electromagnetic load, the current controller comprising comparator means for comparing the voltage on said other access terminal to a predetermined voltage for recognizing a short-circuit of said load to ground and for producing an output signal indicative of said short-circuit condition; and, means responsive to said last-mentioned output signal for acting upon said first voltage means, said second voltage means, said third voltage means and said fourth voltage means in a manner so as to cause the latter to simulate the emergency mode of operation through the respective ones of said current controllers associated therewith, whereby the current through said precision resistor and said electromagnetic load is reduced to zero.

13. The current controller of claim 6, said one access terminal of said precision resistor being on the end of said precision resistor lying away from said electromagnetic load, the current controller comprising comparator means such as a computer for comparing the voltage on said one access terminal to a voltage proportional to the voltage of said first voltage means for recognizing a short-circuit of said load and for making possible a self-calibration of the overall current controller.

14. The current controller of claim 1, the electromagnetic load being a direct-current positioning device such as a magnetic valve for metering fuel to the engine, the current controller further comprising a pulse-duration to voltage converter having a variable output voltage, said first voltage means being connected to the output of said converter for receiving said variable output voltage.

* * * * *